United States Patent
Yu et al.

(10) Patent No.: US 8,683,395 B2
(45) Date of Patent: *Mar. 25, 2014

(54) METHOD AND SYSTEM FOR FEED-FORWARD ADVANCED PROCESS CONTROL

(71) Applicant: Taiwan Semiconductor Manufacturing Company, Ltd., Hsin-Chu (TW)

(72) Inventors: Chih-Jen Yu, Hsinchu (TW); Chun-Hung Lin, Taoyuan (TW); Juin-Hung Lin, Hsinchu (TW); Hsueh-Yi Chung, Zhubei (TW); Li-Kong Turn, Taichung (TW); Keh-Wen Chang, Zaociao Township, Miaoli County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/867,890

(22) Filed: Apr. 22, 2013

(65) Prior Publication Data

US 2013/0239073 A1 Sep. 12, 2013

Related U.S. Application Data

(63) Continuation of application No. 13/086,935, filed on Apr. 14, 2011, now Pat. No. 8,429,569.

(51) Int. Cl.
*G06F 17/50* (2006.01)

(52) U.S. Cl.
USPC ............... 716/54; 716/50; 716/51; 716/52; 716/53; 716/55; 430/5; 430/30

(58) Field of Classification Search
USPC ..................... 716/50–55; 430/5, 30
See application file for complete search history.

(56) References Cited

U.S. PATENT DOCUMENTS

| | | | |
|---|---|---|---|
| RE39,518 E * | 3/2007 | Toprac et al. | 438/17 |
| 7,871,745 B2 * | 1/2011 | Chen et al. | 430/22 |
| 8,027,529 B2 * | 9/2011 | Yu et al. | 382/148 |

* cited by examiner

*Primary Examiner* — Nghia Doan
(74) *Attorney, Agent, or Firm* — Haynes and Boone, LLP (57) ABSTRACT

Embodiments of the present disclosure disclose a method of forming a new integrated circuit design on a semiconductor wafer using a photolithography tool. The method includes selecting a previously processed wafer having a past integrated circuit design different than the new integrated circuit design, selecting a plurality of critical dimension (CD) data points extracted from the previously processed wafer after the previously processed wafer was etched, and creating a field layout and associated baseline exposure dose map for the new integrated circuit design. The method also includes refining each field in the baseline exposure dose map based on a difference between an average CD for the previously processed wafer and an average CD for each field in the field layout and controlling the exposure of the photolithography tool according to the refined baseline exposure dose map to form the new integrated circuit design on the semiconductor wafer.

19 Claims, 5 Drawing Sheets

METHOD AND SYSTEM FOR FEED-FORWARD ADVANCED PROCESS CONTROL

CROSS-REFERENCE

This application is a continuation of U.S. application Ser. No. 13/086,935, filed on Apr. 14, 2011, which is hereby incorporated by reference in its entirety

BACKGROUND

The present disclosure relates generally to semiconductor fabrication, and more particularly, to semiconductor fabrication process control.

As performance requirements and throughput demands increase, semiconductor fabrication process control has become even more crucial. However, as process geometries decrease, such as from 65 to 45 nanometer and beyond, it may be challenging to keep process variations at acceptable levels. As such, the processes may suffer from losses in tool productivity, increased operator interaction, yield loss, and higher rework rates, all possibly leading to higher costs. Advanced Process Control (APC), which may consist of models and feedback systems among other process control techniques, has been widely used to help alleviate some of the variations. However sufficient APC methods may be lacking, especially during the initial processing of a new chip design. Traditionally, when a new design needs to be implemented on a wafer, the pilot processing run may require three or more feedback cycles before a quality parameter, such as critical dimension uniformity, is within tolerance (each cycle corresponding to a patterned test wafer). These cycles are time consuming and each additional cycle may add approximately one and a half days to the pilot run time. One reason pilot runs require multiple cycles is because the optimal semiconductor processing parameters are unknown on the initial cycle. Moreover, processing feedback is not available until after the first cycle. Consequently, although existing APC techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the fabrication of semiconductor devices, and more particularly, to process control of the fabrication of semiconductor devices. It is understood, however, that specific embodiments are provided as examples to teach the broader inventive concept, and one of ordinary skill in the art can easily apply the teaching of the present disclosure to other methods or apparatus. Also, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
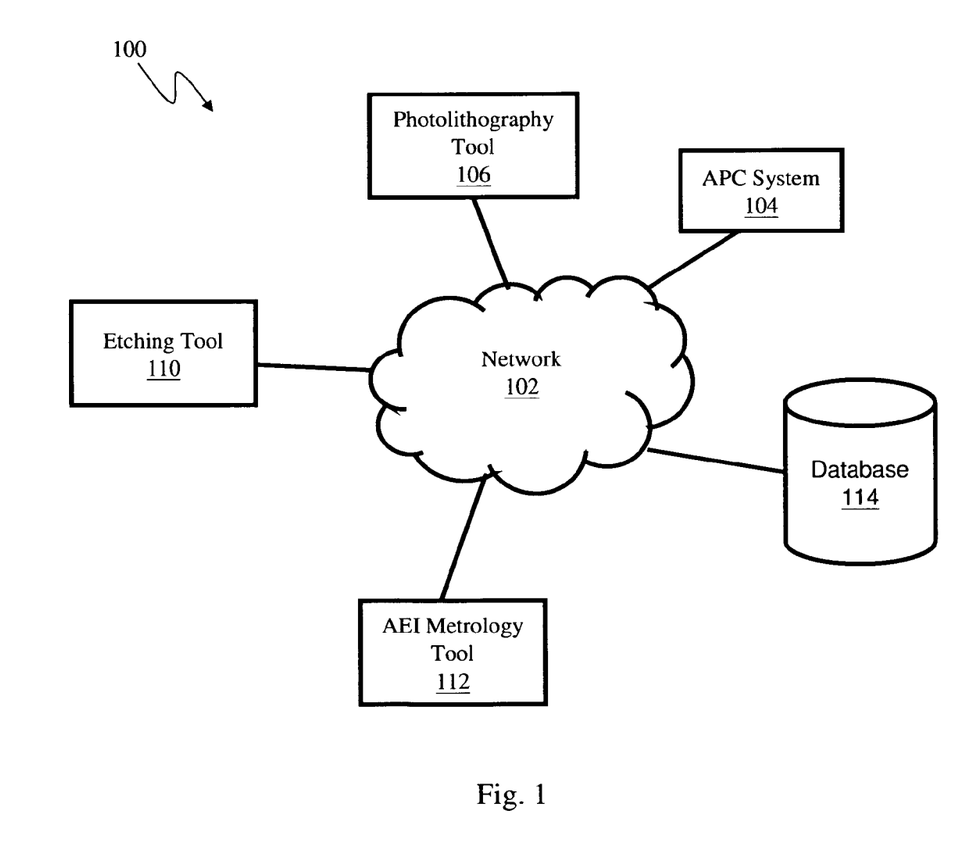
FIG. 1 is a functional block diagram of a semiconductor fabrication system that embodies various aspects of the present disclosure.

FIG. 1 is a functional block diagram of a semiconductor fabrication system 100 that embodies various aspects of the present disclosure. The system 100 comprises a plurality of entities that are connected by a communications network 102. The network 102 may be a single network or may be a variety of different networks, such as an intranet and the Internet, and may include both wired and wireless communication channels. Each entity may interact with other entities and may provide services to and/or receive services from the other entities. In the present embodiment, the entities include an Advanced Process Control (APC) system 104, a photolithography tool 106, an etching tool 110, an after-etching-inspection (AEI) metrology tool 112, and a database 114. It is understood that the system 100 may further comprise various other processing tools (e.g., deposition tools, chemical mechanical polishing (CMP) tools, furnaces, etc.), metrology equipment, and controllers that perform other stages of semiconductor fabrication but are not illustrated for the sake of simplicity and clarity.

The photolithography tool 106 is a device of a type known in the art. The photolithography tool 106 is used to pattern a photosensitive layer (e.g., photoresist) with various features that form an integrated circuit. The photolithography tool 106 uses intense light to pattern the photoresist. In general, tuning the light exposure affects the structural features of the resulting integrated circuit, such as critical dimension (CD). In some embodiments, exposure dose is tuned by adjusting the intensity of the light and the speed at which the wafer is scanned. In an embodiment, the photolithography tool 106 includes an immersion lithography tool. In other embodiments, the photolithography tool 106 may be implemented or replaced by other proper tools such as maskless photolithography, electron-beam writing, ion-beam writing, and molecular imprint tools.

The etching tool 110 is a device of a type known in the art, and includes one or more etching chambers that are not separately illustrated. A semiconductor wafer is placed in the etching chamber, and then is subjected to an etching process. The after-etch-inspection (AEI) metrology tool 112 is a device of a type known in the art. The AEI metrology tool 112 inspects and checks for defects, contamination, and CD following the etching process. In an embodiment, the AEI metrology tool 112 includes an optical spectrum (e.g., optical critical dimension or OCD) metrology tool to measure CD and/or profiles of etched features. The CD information may be stored in the database 114 and/or provided to the APC system 104.

The database 114 may be of a type known in the art. In the current, embodiment the database 114 stores historical processing data for the semiconductor processing system 100. The historical data may include a list of all wafers processed by the photolithography tool 106 and the etching tool 110. Further, for each wafer in the list of previously processed wafers, a set of structural characteristic data for the wafer may be stored in the database 114. The structural characteristic data may include measurement data extracted while each wafer was being processed. In the current embodiment, the measurement data may include critical dimension data extracted by the AEI metrology tool 112. In other embodiments, the database 114 may include other historical processing data indicative of the characteristics of the processing tools in the processing system 100, such as the photolithography tool 106 and the etching tool 110.

Aspects of the present disclosure may be implemented within the APC system 104 to analyze information from the AEI metrology tool 112 or the database 114 or other proper equipment in the system 100. The APC system 104 may comprise a computer that can be a conventional, commercially-available computer, or any other suitable computer hardware. The hardware of the APC system 104 includes a processor and a non-transitory memory. The memory stores a computer program that is executed by the processor, and that causes the computer to control the photolithography tool 106 and etching tool 110. The computer is operable to perform actions including manipulating information (including manipulating information using a model), receiving information, storing information, and transferring information. The information may include, for example, commands, process parameters such as those parameters used in the process recipe, measurement data, process data such as the history of processes ran including specific tool or tool sector used and process parameters used, and/or equipment status. In an embodiment, the computer may include multiple computers. In an embodiment, the computer may include equipment or code embedded in a process tool, such as, for example the photolithography tool 106 or the etching tool 110. The computer may further include one or multiple user interfaces.

Figure 2:
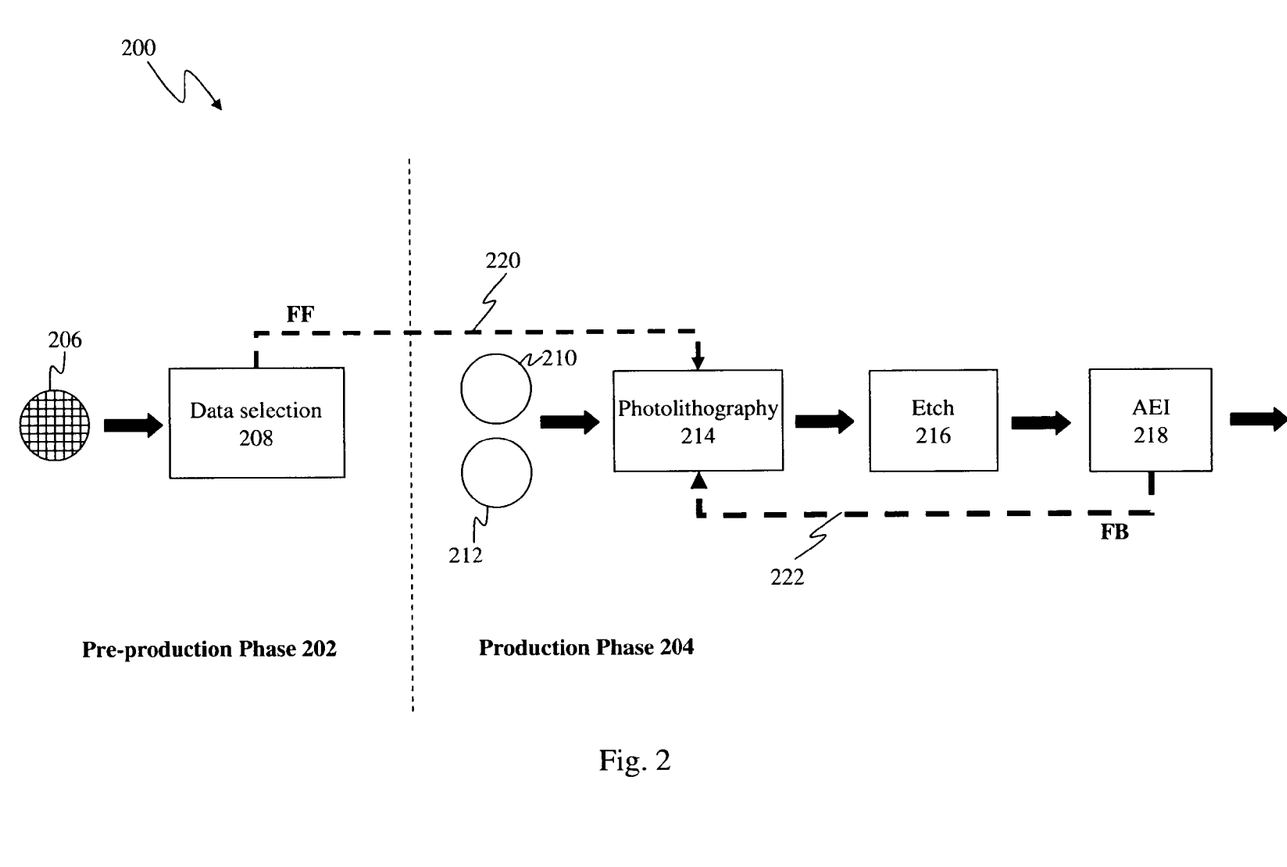
FIG. 2 is a functional block diagram of a semiconductor fabrication process flow implemented by semiconductor fabrication system of FIG. 1.

FIG. 2 is a functional block diagram of a semiconductor fabrication process flow 200 implemented by semiconductor fabrication system 100. In the current embodiment, the process flow 200 is a process flow for a pilot fabrication run of a new chip design (new tapeout) on a semiconductor wafer. The process flow 200 includes a pre-production phase 202 and a production phase 204. In general, information collected during the pre-production phase 202 is fed forward to the production phase 204 to reduce the time required for the production phase. As illustrated in FIG. 2, the process flow 200 includes a material process flow, illustrated as solid lines, and an information flow, illustrated as dashed lines.

First, during pre-production phase 202, a previously finished (or processed) wafer 206 with a previously processed chip design is selected from the historical data stored on the database 114. The finished wafer 202 is selected based on certain factors such as similarity of the previously processed chip design to the new chip design and time since the finished wafer was fabricated. Further, the finished wafer 206 was produced by the same semiconductor tools in the semiconductor fabrication system 100 as will be used in the pilot run. In one embodiment, the APC system 104 may be used to automatically select a suitable finished wafer based on the new chip design and other factors. In some embodiments, the finished wafer 206 may have been only partially processed. For instance, finished wafer 206 may have only been exposed, etched, and inspected.

After the finished wafer 206 is selected, it proceeds to a data selection process 208. During data selection 208, historical structural characteristic data associated with the finished wafer 206 is analyzed to select a plurality of data points. In one embodiment, the structural characteristic is critical dimension, but in alternative embodiments, it may be a different characteristic. The selected data points may then be stored in the memory of the APC system 104 or be stored in the database 114. The wafer selection and data selection steps will be described in greater detail in association with FIGS. 3 and 4.

Next, in the production phase 204, a first wafer 210 and a second wafer 212 will be sequentially patterned with the new chip design. That is, the production phase 204 of process flow 200 utilizes multiple cycles to properly calibrate the semiconductor tools used in the process. The process flow 200 illustrates three processes: a photolithography process 214, an etching process 216, and an AEI metrology process 218. The processes 214-218 may be performed by the tools and controlled by the APC system 104 described above with reference to FIG. 1. Although two wafers are illustrated, multiple wafers may be processed grouped in lots, as such, the reference to a wafer in the singular in the present disclosure does not by necessity limit the disclosure to a single wafer, but may be illustrative of a lot including a plurality of wafers, a plurality of lots, or any such grouping of material.

In the present embodiment, the wafers 210 and 212 include various material layers (e.g., polysilicon layer, dielectric layer, etc.) formed thereon, and are ready for patterning by the photolithography process 210. Wafer 210 will be processed using processes 214-218 before wafer 212 is subsequently processed. First, during photolithography process 214, a photosensitive layer is formed over a polysilicon layer on wafer 210 and is patterned according to the new chip design. The APC system 104 may control the photolithography process 214 by utilizing feed-forward information 220 from the pre-production phase 202. More specifically, the initial exposure parameters used to pattern the photosensitive layer on wafer 210 are based in part on the data associated with the finished wafer 206. In the current embodiment, the APC system 104 creates a baseline exposure dose map and refines it using the feed-forward information 220. It then uses the refined dose map to control exposure of wafer 210. The creation of the refined exposure dose map based on feed-forward information 220 will be described in greater detail in association with FIGS. 3 and 5. In other embodiments, the APC system 104 may utilize the feed-forward information in a different manner to initially expose wafer 210.

Next, after wafer 210 has been exposed by photolithography process 214, it proceeds on to the etch process 216. In an embodiment, the etching process 230 includes multiple steps wherein the etching tool 110 removes the exposed portions of the photosensitive layer and portions of other layers, such as a polysilicon layer, on wafer 210. The wafer 210 is then inspected by the AEI metrology process 218 to check for defects/contamination and to measure CD of the etched polysilicon layer underlying the patterned photoresist. In an embodiment, the measurement is performed by the AEI metrology tool 112. In an alternative embodiment, the measurement is done by the etching tool 110. Further, in one embodiment, the APC system may then calculate the critical dimension uniformity of the etched features on the wafer 210. As shown in FIG. 2, the APC system 104 gathers feedback information 222 from the AEI process 218 and utilizes it in the next cycle of production phase 204. In an embodiment, the feedback information 222 is based on the CD measurements of wafer 210. The wafer 210 may then be transported to other tools for further processing.

When the wafer 210 has been analyzed by the AEI process 218, fabrication of the new chip design may begin on wafer 212. Like wafer 210, wafer 212 first undergoes the photolithography process 114. However, for this subsequent wafer, the APC system 104 controls the exposure process using the feedback information 222 from the AEI process 218. More specifically, the exposure parameters used to pattern the photosensitive layer on wafer 212 are based on the data collected from wafer 210 during the AEI process 218. In the current embodiment, the APC system 104 updates the refined exposure dose map using the critical dimension data collected from wafer 210. After the wafer 212 is exposed using the updated exposure dose map, it is etched in process 216 and measured in AEI process 218. In the current embodiment, the features in the etched polysilicon layer on wafer 212 are measured and the critical dimension uniformity may be calculated.

As mentioned above, process flow 200 is designed such that data from the pre-production phase 202 increases the efficiency of the production phase 204. More specifically, the feed-forward information 220 reduces the number of production cycles necessary before the new chip design fabrication results are within tolerance. For example, without the feed-forward information 220 with which to refine a baseline exposure dose map, three cycles or more may be required before the CD uniformity of a pilot wafer is within tolerance. In one embodiment, using process flow 200 with feed-forward information 220, the CD uniformity of a pilot wafer after the first cycle may be 1.7 nm (within three standard deviations)—as compared a first cycle CD uniformity of 3.2 nm without the use of feed-forward information 220. If, for example, the CD uniformity tolerance for this new chip design is set at 1.1 nm, only one feedback cycle under process flow 220 is required before the CD uniformity is reduced from 1.7 nm to 1.1 nm. As mentioned above, without feed-forward information, two or more feedback cycles are required after the initial run before the CD uniformity is reduced to 1.1 nm. In one embodiment, a one cycle reduction may save one to one and a half days of fabrication time.

Figure 3:
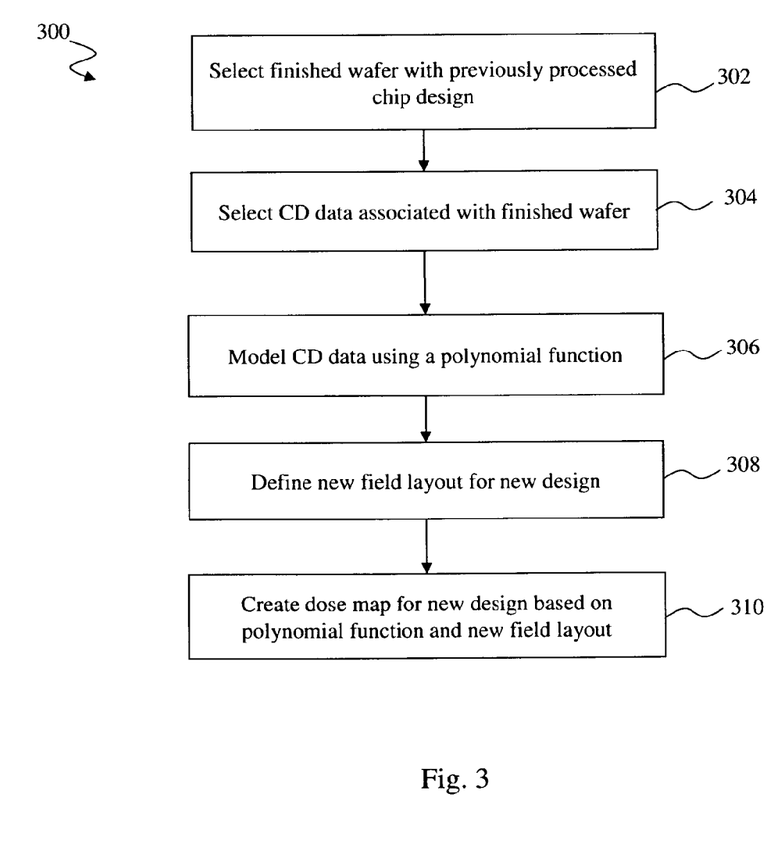
FIG. 3 is a high-level flowchart illustrating a method of feeding forward information in the semiconductor fabrication process flow of FIG. 2.

FIG. 3 is a high-level flowchart illustrating a method 300 of feeding forward information in the process flow 200. More specifically, method 300 describes in more detail the pre-production phase 202 of process flow 200 and the manner in which the APC system 104 uses information collected in the pre-production phase 202 to increase efficiency in the production phase 204. Method 300 begins at block 302 where the finished wafer 206 is selected from historical processing data. As discussed above, the finished wafer 206 embodies a previously processed chip design and was fabricated using the same semiconductor tools utilized by process flow 200. In the current embodiment, the finished wafer 206 is selected based on (1) the specific photolithography tool and etching chamber in which it was patterned, (2) the amount of time since the finished wafer was fabricated, and (3) the similarity of the previously processed chip design to the new chip design. With regard to the first selection criteria, process flow 200 is most efficient when the photolithography tool and etching chamber that will be used to pattern the new chip design on wafers 210 and 212 match the photolithography tool and etching chamber used to pattern the finished wafer 206. With regard to the second selection criteria, even if the same photolithography tools are used for the new chip design, efficiency may not be maximized if the finished wafer was fabricated a substantial amount of time before the new chip design pilot run. This is because performance characteristics of the photolithography and etching tools may drift over time. Ideally, the finished wafer 206 is a wafer that has been fabricated within a week of the pilot run of the new chip design. With regard to the third selection criteria, selecting a finished wafer that embodies a design of substantial similarity to the new chip design will improve the accuracy of the refined exposure dose map applied during the initial photolithography process 214 of the pilot run. In the current embodiment, the more similar the previously processed design is to the new design, the better the CD uniformity of the wafer 210 patterned in the initial pilot run will be. In alternative embodiments, additional or different selection criteria may be used to select a finished wafer 206. Further, in one embodiment, the APC system 104 may automatically select a previously processed wafer based on these selection criteria.

After the finished wafer 206 has been selected, the method 300 proceeds to block 304 where historical measurement data associated with the finished wafer is retrieved and selected. In the current embodiment, data points representing critical dimensions of features etched in a polysilicon layer on the wafer are selected from the historical measurement data. Specifically, the selected CD data points may represent CD measurements taken after etching the finished wafer, for instance by an AEI metrology tool. Further, the CD data points include measurements from a plurality of fields across the wafer. Selecting a greater number of data points on finished wafer 210 increases the amount of data fed forward to production phase 204 and thus improves the refined exposure dose map applied in photolithography process 214. However, as the number of CD data points selected increases, the amount of computation time required to create the refined exposure dose map increases as well. In the current embodiment, a balance between efficiency and exposure dose map accuracy may be achieved by selecting approximately 600-800 CD data points on finished wafer 206. A method for selecting CD data points on wafer 206 is discussed in detail in association with FIG. 4.

Once CD data has been selected from finished wafer 206 in block 304, the method 300 proceeds to block 306 where the CD data is modeled using a polynomial function to define critical dimension as a function of location. In the current embodiment, the APC system 104 models the CD data of wafer 206 using a two-dimensional Zernike polynomial: $f(x, y)=a_0Z_0(x,y)+a_1Z_1(x,y)+a_2Z_2(x,y)+\ldots$. The APC system 104 applies techniques known in the art to find the respective coefficients ($a_0$, $a_1$, $a_2$, etc) of each polynomial in the Zernike polynomial sequence. Because the CD data is extracted from a plurality of points across the entirety of the wafer (inter-field), the Zerinke polynomial represents critical dimension across the entire wafer. In other embodiments, alternative polynomials may be used to model the CD data of finished wafer 206.

Once the critical dimension is defined as a function of location for finished wafer 206, the method 300 proceeds to block 308 where a new field layout is defined for the new chip design. In more detail, the APC system 104 analyzes the new chip design and defines a new field layout based on the new design. The new field layout defines the size and location of each field to be scanned on the new wafers 210 and 212. The new field layout may be different from the field layout of the finished wafer 206.

Finally, method 300 proceeds to block 310 where an exposure dose map is created for the photolithography process 214 in the initial cycle of the production phase 204. In more detail, the APC system 104 first creates a baseline exposure dose map using the new field layout. In the current embodiment, the baseline exposure dose is the same for each field in the layout and may be based in part on data obtained from the photoresist vendor photolithography tool manufacturer. In alternative embodiments, the baseline exposure dose map may be derived from other factors and may not dictate that each field receives the same exposure dose. Second, after defining a baseline dose map, the APC system 104 refines the exposure dose for each field based on the Zernike polynomial function, which is defined by the CD data from finished wafer 206. A method for refining the baseline exposure dose map is discussed in detail in association with FIG. 5. As mentioned above, starting with a more accurate dose map on the first cycle of the new chip design pilot run reduces the number of cycles required to bring critical dimension uniformity within tolerance.

Figure 4:
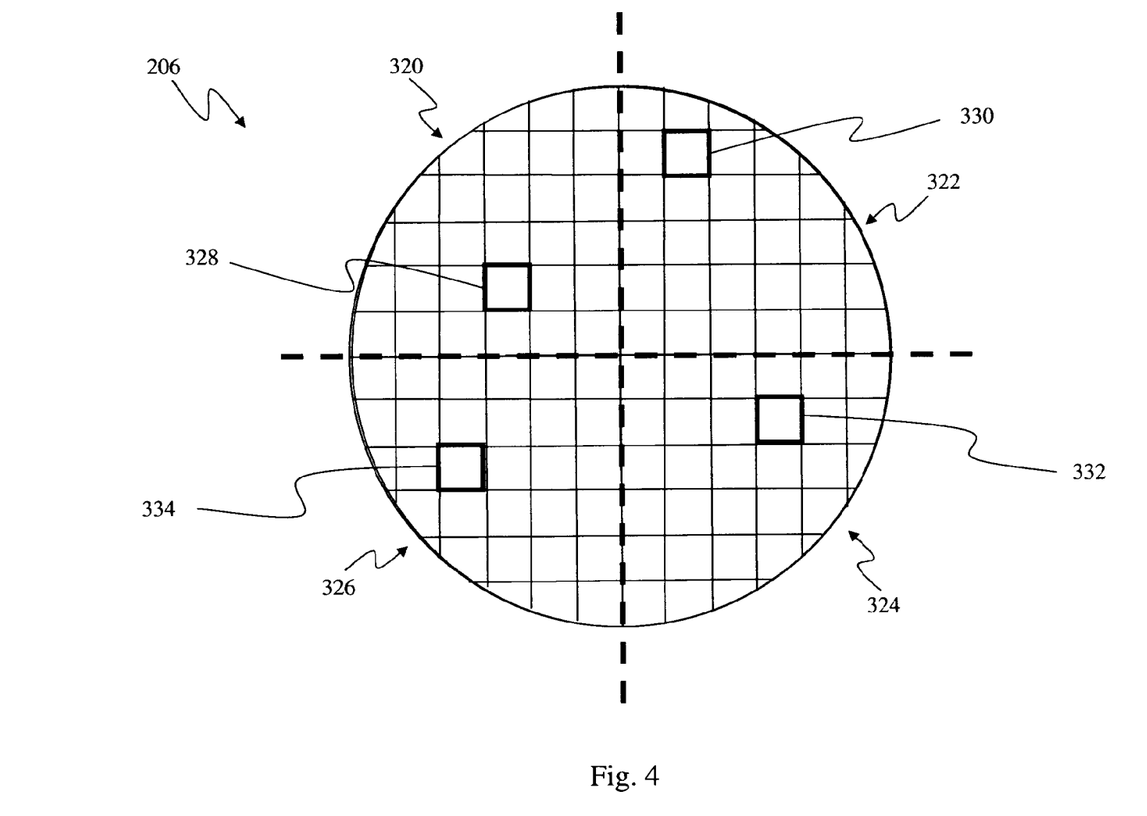
FIG. 4 illustrates an exemplary embodiment of a portion of the method of feeding forward information of FIG. 3.

FIG. 4 illustrates a method of selecting a subset of data from the finished wafer 206 of FIG. 2. Specifically, this method is an exemplary embodiment of the process described in association with block 304 of method 300 in FIG. 3. As mentioned above, selecting too many critical dimension data points on wafer 206 may decrease efficiency of the production phase 204 because of increased computation time. As such, the method illustrated by FIG. 4 selects a practical amount of CD data (e.g. about 600-800 measurement points) from finished wafer 206. First, the fields on wafer 206 are divided into four equal groups: 320, 322, 324, and 326. Second, a primary field from each group is randomly selected. Here, primary fields 328, 330, 332, and 334 are respectively selected from groups 320, 322, 324, and 326. Third, approximately 60 CD data points extracted from each of the primary fields 328, 330, 332, and 334 are selected. Finally, approximately 16 CD data points from each of the remaining fields on the wafer 206 are selected. The subset of CD data fed forward to the production phase 204 consists of the above selected data points. In one embodiment, the APC system 104 may automatically define the groups, choose the primary sections, and collect the critical dimension data. Further, in alternative embodiments, the number of groups, number of primary fields, and number of measurements taken may vary, or the method of selecting a practical amount may be completely different.

Figure 5:
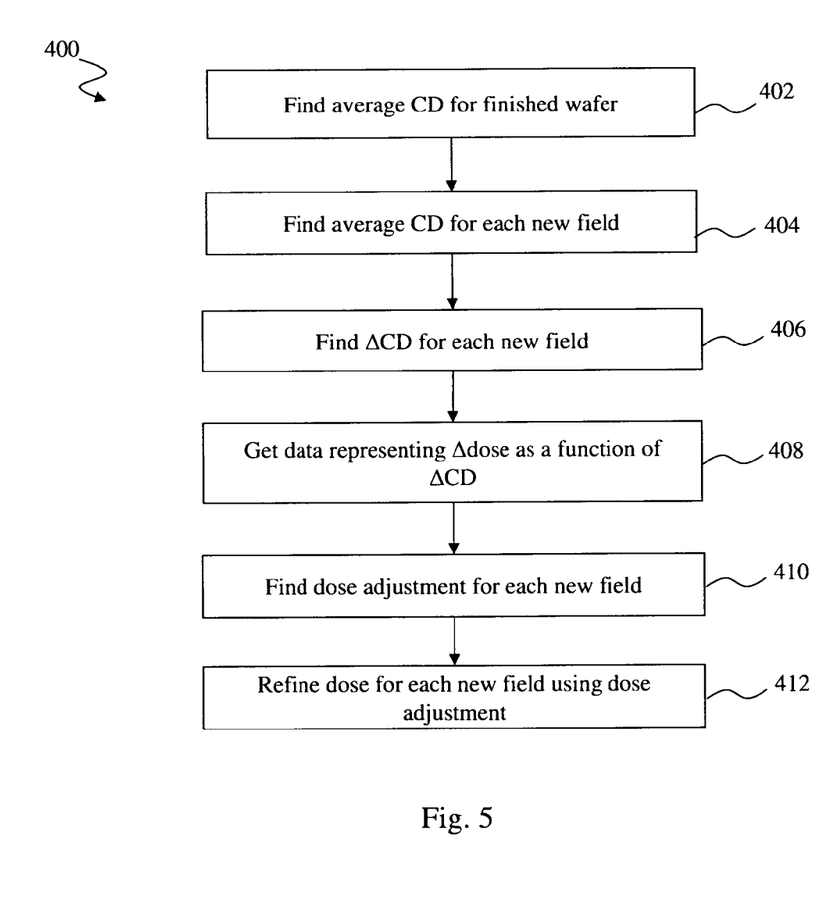
FIG. 5 is a high-level flowchart illustrating an exemplary embodiment of another portion of the method of feeding forward information of FIG. 3.

FIG. 5 is a high-level flowchart illustrating a method 400 for creating a refined exposure dose map for the initial photolithography process 214 in FIG. 2. Method 400 is an exemplary embodiment of the process described in association with block 310 of method 300 in FIG. 3. Method 400 begins at block 402 where the average critical dimension for the finished wafer 206 is calculated. In the current embodiment, the average CD of wafer 206 is calculated using the Zernike polynomial function found in block 306 of method 300. Next, method 400 proceeds to block 404 where the average CD is found for each field in the new field layout defined in block 308 of method 300. More specifically, in the current embodiment, the Zernike polynomial function is applied to a plurality of positions within each field in the new field layout to get a plurality of critical dimension data points for each field. These CD data points are averaged within each field to arrive at a CD average for each new field. In alternative embodiments, the average CD for each field may be calculated by other methods. Then, at block 406, $\Delta CD$ is found for each new field. In the current embodiment, $\Delta CD$ for a particular field is equal to the difference between the average CD for the wafer 206 and the average CD for that field. Next, method 400 proceeds to block 408 where exposure characteristic data is gathered for the photolithography tool to be used in the photolithography process 214. In particular, data representing how a change to exposure dose alters critical dimension is gathered. In one embodiment, the manufacturer of the photolithography tool 106 may provide a curve embodying $\Delta dose$ as a function of $\Delta CD$. Then, in block 410, a dose adjustment is found for each of the fields in the new field layout by applying $\Delta CD$ to the $\Delta dose$ function provided in block 408. Finally, in block 412, a refined exposure dose is found for each field in the new field layout. In the current embodiment, the dose adjustment for each new field is added to the exposure amount dictated by the baseline exposure dose map found in block 310 of method 300. Applying the dose adjustment to each field of the baseline dose map results in a refined exposure dose map, in which each field may have a different exposure value. As mentioned above, the refined exposure dose map may then be used by the APC system 104 to control the initial photolithography process 214. In some embodiments, the steps of method 400 may be automatically carried out by the APC system 104 upon receiving the feed-forward data 220 from the pre-production phase 202. Further, in other embodiments, method 400 may alternatively include additional steps or include different steps.

Although the embodiment discussed above involves APC control of a process to pattern a polysilicon layer on a semiconductor substrate, it would alternatively be possible to use the disclosed technique to control some other aspect of a semiconductor fabrication process. For example, information may be collected about a previously processed wafer and fed-forward to control a CMP process or an overlay process for the pilot run of a new chip design.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method of forming a new integrated circuit design on a semiconductor wafer using a photolithography tool, the method comprising:
   selecting a previously processed wafer having a past integrated circuit design, wherein the past integrated circuit design is different than the new integrated circuit design;
   selecting a plurality of critical dimension (CD) data points extracted from the previously processed wafer after the previously processed wafer was etched, the plurality of CD data points having a first average CD;
   creating a field layout and associated baseline exposure dose map for the new integrated circuit design, each field in the field layout having a second average CD;
   refining each field in the baseline exposure dose map based on a difference between the first average CD for the previously processed wafer and the second average CD for each field in the field layout; and
   controlling the exposure of the photolithography tool according to the refined baseline exposure dose map to form the new integrated circuit design on the semiconductor wafer.

2. The method of claim 1, further including, after selecting the plurality of CD data points, creating an inter-field model of the CD data points with a polynomial function that relates CD to position on the previously processed wafer.

3. The method of claim 2,
   wherein the average CD for the previously processed wafer is calculated using the inter-field model; and
   wherein the average CD for each field in the field layout is calculated using the inter-field model.

4. The method of claim 2, wherein the polynomial function is a Zernike polynomial function.

5. The method of claim 1, wherein refining each field in the baseline exposure dose map includes:

calculating a dose adjustment for each field in the baseline exposure dose map based on the difference between the average CD for the previously processed wafer and the average CD for each field in the field layout; and adding to each field of the baseline exposure dose map the respective dose adjustment.

6. The method of claim 5, wherein the calculating the dose adjustment for each field is further based on exposure characteristic data for the photolithography tool that represents the relationship between exposure dose and CD.

7. The method of claim 1, wherein the selecting the previously processed wafer is based on one or more of the similarity of the past integrated circuit design to the new integrated circuit design, an amount of time since the previously processed wafer was processed, and the process tools used to form the past integrated circuit design on the previously processed wafer.

8. The method of claim 1, wherein the selecting the plurality of CD data points includes:

selecting the plurality of CD data points from a plurality of fields on the previously processed wafer; and selecting a subset of the plurality of CD data points, the subset including CD data points extracted from a plurality of fields on the previously processed wafer.

9. The method of claim 8, wherein the selecting the subset includes:

grouping fields on the processed wafer into a plurality of groups;

randomly selecting a primary field from each of the plurality of groups; and selecting a first number of CD data points from each of the primary fields and a second number of CD data points from each of the remaining fields on the previously processed wafer, the first number being greater than the second number.

10. The method of claim 9, wherein the plurality of groups includes four groups; and wherein the first number of CD data points includes approximately sixty data points and the second number of CD data points includes approximately sixteen data points.

11. An advanced process control (APC) system for forming a new integrated circuit design on a semiconductor wafer with a semiconductor processing tool, the system comprising:

a database operable to store historical data about processed wafers; and a controller operable to control the semiconductor processing tool based on a plurality of instructions stored in a non-transitory, computer-readable memory, the plurality of instructions including instructions that:

select, from the historical data, a processed wafer having a past integrated circuit design, wherein the past integrated circuit design is different than the new integrated circuit design;

select a plurality of critical dimension (CD) data points extracted from the processed wafer after the processed wafer was etched, the plurality of CD data points having a first average CD;

create a field layout and associated baseline exposure dose map for the new integrated circuit design, each field in the field layout having a second average CD;

refine each field in the baseline exposure dose map based on a difference between the first average CD for the processed wafer and the second average CD for each field in the field layout; and control the exposure of the semiconductor processing tool according to the refined baseline exposure dose map to form the new integrated circuit design on the semiconductor wafer.

12. The APC system of claim 11, wherein the plurality of instructions further include instructions that create an inter-field model of the CD data points with a polynomial function that relates CD to position on the processed wafer.

13. The APC system of claim 12, wherein the average CD for the processed wafer is calculated using the inter-field model; and wherein the average CD for each field in the field layout is calculated using the inter-field model.

14. The APC system of claim 11, wherein the instructions that refine each field in the baseline exposure dose map include instructions that:

calculate a dose adjustment for each field in the baseline exposure dose map based on the difference between the average CD for the processed wafer and the average CD for each field in the field layout; and add to each field of the baseline exposure dose map the respective dose adjustment.

15. The APC system of claim 11, wherein the instructions that select the processed wafer do so based on one or more of the similarity of the past chip design to the new chip design, an amount of time since the processed wafer was processed by the semiconductor processing tool, and an identity of semiconductor processing tools used to process the processed wafer.

16. The APC system of claim 11, wherein the instructions that select the plurality of CD data points include instructions that:

select the plurality of CD data points from a plurality of fields on the processed wafer; and select a subset of the plurality of CD data points, the subset including CD data points extracted from a plurality of fields on the processed wafer.

17. The APC system of claim 16, wherein the instructions that select a subset of data points include instructions that:

group fields on the processed wafer into a plurality of groups;

randomly select a primary field from each of the plurality of groups; and select a first amount of data points from each of the primary fields and a second amount of data points from each of the remaining fields on the wafer, the first amount being greater than the second amount.

18. A method of forming a new integrated circuit design on a semiconductor wafer using a photolithography tool, the method comprising:

selecting a previously processed wafer having a past integrated circuit design, the past integrated circuit design being different than the new integrated circuit design, and the previously processed wafer having a plurality of critical dimension (CD) data points extracted therefrom after being etched, the plurality of CD data points having a first average CD;

selecting a subset of the plurality of critical dimension (CD) data points by grouping fields on the processed wafer into a plurality of groups and selecting CD data points from a plurality of fields in each of the plurality of groups;

creating an initial exposure dose map for the new integrated circuit design using the subset of the plurality of CD data points, wherein creating the initial exposure dose map includes:

creating a field layout and associated baseline exposure dose map for the new integrated circuit design, each field in the field layout having a second average CD; and refining each field in the baseline exposure dose map based on a difference between the first average CD for the previously processed wafer and the second average CD for each field in the field layout; and controlling the exposure of the photolithography tool according to the initial exposure dose map to form the new integrated circuit design on the semiconductor wafer.

19. The method of claim 18, wherein selecting CD data points from the plurality of fields in each of the plurality of groups includes:

randomly selecting a primary field from each of the plurality of groups; and selecting a first number of CD data points from each of the primary fields and a second number of CD data points from each of the remaining fields on the wafer, the first number being greater than the second number.

\* \* \* \* \*